United States Patent
Lee et al.

(10) Patent No.: US 10,608,664 B2
(45) Date of Patent: Mar. 31, 2020

(54) ELECTRONIC APPARATUS FOR COMPRESSION AND DECOMPRESSION OF DATA AND COMPRESSION METHOD THEREOF

(71) Applicant: SAMSUNG ELECTRONICS CO., LTD., Suwon-si (KR)

(72) Inventors: Dongsoo Lee, Suwon-si (KR); Youngchul Cho, Suwon-si (KR); Kwanghoon Son, Suwon-si (KR); Byeoungwook Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/240,075

(22) Filed: Jan. 4, 2019

(65) Prior Publication Data

US 2019/0348997 A1  Nov. 14, 2019

(30) Foreign Application Priority Data

May 9, 2018  (KR) .................. 10-2018-0053350
Nov. 9, 2018  (KR) .................. 10-2018-0137595

(51) Int. Cl.
*H04N 7/26*  (2006.01)
*H03M 7/32*  (2006.01)
(Continued)

(52) U.S. Cl.
CPC .......... *H03M 7/3024* (2013.01); *G06N 3/082* (2013.01); *G06N 20/00* (2019.01);
(Continued)

(58) Field of Classification Search
CPC . H03M 1/12; H03M 5/00; H03M 7/00; G05B 13/00; G06N 7/02
(Continued)

(56) References Cited

U.S. PATENT DOCUMENTS 7,164,796 B1  1/2007  Silver et al.
7,330,137 B2  2/2008  Liu
(Continued)

FOREIGN PATENT DOCUMENTS

KR  10-2016-0119858 A  10/2016

OTHER PUBLICATIONS

Lee et al., "Viterbi-based Pruning for Sparse Matrix with Fixed and High Index Compression Ratio", ICLR 2018, May 2, 2018, pp. 1-16 (16 pages total).
(Continued)

*Primary Examiner* — Joseph J Lauture
(74) *Attorney, Agent, or Firm* — Sughrue Mion, PLLC

(57) ABSTRACT

A data compression method and a data decompression method are provided. The method includes pruning an original data including a plurality of weight parameters, identifying at least one first weight parameter of which at least one first value is not changed by the pruning, among multiple weight parameters included in the pruned original data, and obtaining a first index data including location information of the at least one first weight parameter of which the at least one first value is not changed, identifying at least one second weight parameter of which at least one second value is changed by the pruning, among the multiple weight parameters included in the pruned original data, and substituting the at least one second weight parameter of which the at least one second value is changed with a don't care parameter.

22 Claims, 9 Drawing Sheets

(51) Int. Cl.
*G06N 20/00* (2019.01)
*G06N 3/08* (2006.01)
*H03M 13/41* (2006.01)
*G05B 13/00* (2006.01)
*H03M 5/00* (2006.01)
*G06N 7/02* (2006.01)
*H03M 1/12* (2006.01)
*H03M 7/00* (2006.01)

(52) U.S. Cl.
CPC ......... *H03M 13/4107* (2013.01); *G05B 13/00* (2013.01); *G06N 7/02* (2013.01); *H03M 1/12* (2013.01); *H03M 5/00* (2013.01); *H03M 7/00* (2013.01)

(58) Field of Classification Search
USPC ............................... 341/200, 50; 706/12, 52
See application file for complete search history.

(56) References Cited

U.S. PATENT DOCUMENTS

| | | |
|---|---|---|
| 8,214,170 B2 | 7/2012 | Crosby et al. |
| 2015/0294217 A1 | 10/2015 | Aparicio, IV |
| 2016/0217369 A1 | 7/2016 | Annapureddy et al. |
| 2016/0292589 A1 | 10/2016 | Taylor, Jr. et al. |
| 2018/0046901 A1 | 2/2018 | Xie et al. |
| 2018/0046914 A1 | 2/2018 | Li et al. |
| 2018/0046915 A1 | 2/2018 | Sun et al. |
| 2018/0046919 A1 | 2/2018 | Li et al. |
| 2018/0204111 A1* | 7/2018 | Zadeh ................. G06N 3/0436 |

OTHER PUBLICATIONS

Han et al., "Deep Compression: Compressing Deep Neural Networks with Pruning, Trained Quantization and Huffman Coding", ICLR 2016, May 4, 2016, pp. 1-14 (14 total pages).

Xu et al., "Alternating Multi-bit Quantization for Recurrent Neural Networks", ICLR 2018, May 2, 2018, pp. 1-13 (13 pages total).

Daehyun Ahn et al., "Double Viterbi: Weight Encoding for High Compression Ratio and Fast On-Chip Reconstruction for Deep Neural Network", OpenReview.net, Nov. 27, 2018, pp. 1-14.

International Search Report (PCT/ISA/210) dated Apr. 2, 2019 issued by the International Searching Authority in International Application No. PCT/KR2019/000134.

Written Opinion (PCT/ISA/237) dated Apr. 2, 2019 issued by the International Searching Authority in International Application No. PCT/KR2019/000134.

\* cited by examiner

1. Target faults

2. Generate test cubes (1-5%)

3. Random fill (95-99%)

ELECTRONIC APPARATUS FOR COMPRESSION AND DECOMPRESSION OF DATA AND COMPRESSION METHOD THEREOF

CROSS-REFERENCE TO RELATED APPLICATIONS

This application is based on and claims priority under 35 U.S.C. § 119(a) of Korean Patent Application No. 10-2018-0053350, filed on May 9, 2018, and Korean Patent Application No. 10-2018-0137595, filed on Nov. 9, 2018, in the Korean Intellectual Property Office, the disclosures of which are incorporated by reference herein in their entireties.

BACKGROUND

1. Field

The disclosure relates to a method for compressing and decompressing data. More particularly, the disclosure relates to an electronic apparatus capable of performing compression in parallel.

In addition, the disclosure relates to an artificial intelligence (AI) system for mimicking functions such as cognition, decision of human brain and the like, using a machine learning algorithm, and an application thereof.

2. Description of Related Art

The AI system is a computer system that implements intelligence of a human level, and is a system in which a machine learns and decides by itself to get smart, unlike previous rules-based smart system. As the AI system is used more and more, a recognition rate is improved and thus, a taste of a user is understood more accurately. Accordingly, the previous rules-based smart system is gradually replaced with a deep-learning AI system.

The AI technology includes a machine learning (deep learning) and element technologies using the machine learning.

The machine learning is an algorithm technology that classifies and learns features of input data by itself. The element technology is a technique that uses a machine learning algorithm such as deep learning and the like, which includes technical fields including linguistic understanding, visual understanding, inference/prediction, knowledge expression, motion control and the like.

Various fields to which the AI technology is applied are as follows. The linguistic understanding is a technique of recognizing a language and character of human and applying and processing the same, which includes natural language processing, machine translation, conversation system, question and answer, voice recognition and synthesis and the like. The visual understanding is a technique of recognizing and processing an object just like a human sight, which includes object recognition, object tracking, image search, human recognition, scene understanding, space understanding, image improvement and the like. The inference prediction is a technique of determining information and make a logical inference and prediction, which includes knowledge/probability-based inference, optimization prediction, preference-based plan, recommendation and the like. The knowledge expression is a technique of performing automation processing with respect to experience information of human with knowledge data, which includes knowledge construction (data generation/classification), knowledge management (data usage) and the like. The motion control is a technique of controlling an autonomous driving of a vehicle and movement of a robot, which includes a motion control (navigation, collision, drive), manipulation control (behavioral control) and the like.

In recent years, the deep learning technology, which is an artificial intelligence field, has been discussed. In general, in a case of a deep learning model of which a memory size is large, there is an aspect that it is difficult to use the deep learning model in a normal electronic apparatus, such as a smartphone, due to limitation of a memory size.

In addition, in a case in which a previous compression method is applied to a deep learning that is appropriate for parallel operation, there are many problems in terms of utilization of memory bandwidth, and power consumption is also large.

SUMMARY

Provided are an electronic apparatus and data compression method for compressing a weight parameter of an artificial intelligence model.

Provided are also an electronic apparatus and decompression method for decompressing a compressed data.

Additional aspects will be set forth in part in the description that follows and, in part, will be apparent from the description, or may be learned by practice of the presented embodiments.

In accordance with an aspect of the disclosure, there is provided a data compression method of compressing a weight parameter of an artificial intelligence model, the method being performed by an electronic apparatus, and the method including pruning an original data including a plurality of weight parameters, identifying at least one first weight parameter of which at least one first value is not changed by the pruning, among multiple weight parameters included in the pruned original data, and obtaining a first index data including location information of the at least one first weight parameter of which the at least one first value is not changed. The method further includes identifying at least one second weight parameter of which at least one second value is changed by the pruning, among the multiple weight parameters included in the pruned original data, substituting the at least one second weight parameter of which the at least one second value is changed with a don't care parameter, and quantizing, to a n bit, a first data including the at least one first weight parameter of which the at least one first value is not changed and the don't care parameter with which the at least one second weight parameter is substituted. The method further includes obtaining a n number of second data, based on the first data quantized to the n bit, and obtaining a n number of compressed data by applying, to a Viterbi algorithm, each of the obtained n number of second data.

The first data may be in a matrix form, and the quantizing the first data may include quantizing each of the at least one first weight parameter of which the at least one first value is not changed and the don't care parameter with which the at least one second weight parameter is substituted, in the matrix form.

The n number of second data may include a 2-1 data including a first bit value of the at least one first weight parameter quantized to the n bit, and a first bit of the don't care parameter quantized to the n bit, and a 2-2 data including a second bit value of the at least one first weight parameter quantized to the n bit, and a second bit of the don't care parameter quantized to the n bit.

The obtaining the n number of compressed data may include comparing an output data that is output by inputting at least one compression candidate data to at least one Viterbi decompressor, with the obtained n number of second data, and based on the obtained n number of second data and the output data being matched at over a predetermined ratio, obtaining the at least one compression candidate data, as the n number of compressed data.

The comparing may include comparing only pieces of data corresponding to the at least one first weight parameter of which the at least one first value is not changed, among the n number of second data, with the output data.

The data compression method may further include obtaining a compressed index data by applying the first index data to the Viterbi algorithm.

The obtaining the compressed index data may include comparing an output data that is output by inputting at least one compression candidate data to a Viterbi-decompressor, with the first index data, and based on the first index data and the output data being matched at over a predetermined ratio, obtaining the at least one compression candidate data, as the compressed index data.

The data compression method may further include storing the compressed index data, the n number of compressed data, and a table data for the quantizing.

In accordance with an aspect of the disclosure, there is provided an electronic apparatus for compressing a weight parameter of an artificial intelligence model, the apparatus including a memory storing instructions, and a processor configured to execute the stored instructions to prune an original data including a plurality of weight parameters, identify at least one first parameter of which at least one first value is not changed by the pruning, from among multiple weight parameters included in the pruned original data, and obtain a first index data including location information of the at least one first weight parameter of which the at least one first value is not changed. The processor is further configured to execute the stored instructions to identify at least one second weight parameter of which at least one second value is changed by the pruning, among the multiple weight parameters included in the pruned original data, substitute the at least one second weight parameter of which the at least one second value is changed with a don't care parameter, and quantize, to a n bit, a first data including the at least one first weight parameter of which the at least one first value is not changed and the don't care parameter with which the at least one second weight parameter is substituted. The processor is further configured to execute the stored instructions to obtain a n number of second data, based on the first data quantized to the n bit, and obtain a n number of compressed data by applying, to a Viterbi algorithm, each of the obtained n number of second data.

The first data may be in a matrix form, and the processor may be further configured to execute the stored instructions to quantize each of the at least one first weight parameter of which the at least one first value is not changed and the don't care parameter with which the at least one second weight parameter is substituted, in the matrix form.

The n number of second data may include a 2-1 data including a first bit value of the at least one first weight parameter quantized to the n bit, and a first bit of the don't care parameter quantized to the n bit, and a 2-2 data including a second bit value of the at least one first weight parameter quantized to the n bit, and a second bit of the don't care parameter quantized to the n bit.

The processor may be further configured to execute the stored instructions to compare an output data that is output by inputting at least one compression candidate data to at least one Viterbi decompressor, with the obtained n number of second data, and based on the obtained n number of second data and the output data being matched at over a predetermined ratio, obtain the at least one compression candidate data, as the n number of compressed data.

The processor may be further configured to execute the stored instructions to compare only pieces of data corresponding to the at least one first weight parameter of which the at least one first value is not changed, among the n number of second data, with the output data.

The processor may be further configured to execute the stored instructions to obtain a compressed index data by applying the first index data to the Viterbi algorithm.

The processor may be further configured to execute the stored instructions to compare an output data that is output by inputting at least one compression candidate data to a Viterbi-decompressor, with the first index data, and based on the first index data and the output data being matched at over a predetermined ratio, obtain the at least one compression candidate data, as the compressed index data.

The memory may be further configured to store the compressed index data, the n number of compressed data, and a table data for quantization of the first data.

In accordance with an aspect of the disclosure, there is provided a decompression method of decompressing a compressed data, the method being performed by an electronic apparatus, and the method including receiving a compressed index data and a n number of compressed data, obtaining a first index data by applying the compressed index data to a first Viterbi decompressor, and obtaining a n number of first data by applying the n number of compressed data respectively to a plurality of Viterbi decompressors. The method further includes obtaining a pruned original data, based on the first index data and the n number of first data.

The decompression method may further include inputting the pruned original data to an artificial intelligence model, retraining the artificial intelligence model to which the pruned original data is input, and obtaining a plurality of weight parameters applied to the artificial intelligence model, based on a result of the retraining.

In accordance with an aspect of the disclosure, there is provided an electronic apparatus for decompressing a compressed data, the apparatus including a memory storing instructions, and a processor configured to execute the stored instructions to receive a compressed index data and a n number of compressed data, obtain a first index data by applying the compressed index data to a first Viterbi decompressor, and obtain a n number of first data by applying the n number of compressed data respectively to a plurality of Viterbi decompressors. The processor is further configured to execute the stored instructions to obtain a pruned original data, based on the first index data and the n number of first data.

The processor may be configured to input the pruned original data to an artificial intelligence model, retrain the artificial intelligence model to which the pruned original data is input, and obtain a plurality of weight parameters applied to the artificial intelligence model, based on a result of retraining the artificial intelligence model.

In accordance with an aspect of the disclosure, there is provided a data compression method being performed by an electronic apparatus, the method including pruning an original data including a plurality of weight parameters of an artificial intelligence model, obtaining a first index data including location information of at least one first weight parameter of which at least one first value is not changed by the pruning, among multiple weight parameters included in the pruned original data, and obtaining a first data by substituting, with a don't care parameter, at least one second weight parameter of which at least one second value is changed by the pruning, among the multiple weight parameters included in the pruned original data, and quantizing, to a n bit, the at least one first weight parameter of which the at least one first value is not changed and the don't care parameter with which the at least one second weight parameter is substituted. The method further includes obtaining a second data, based on the first data quantized to the n bit, and obtaining a compressed index data and a compressed data by applying, to a Viterbi algorithm, each of the first index data and the second data.

The second data may include a 2-1 data including a first bit value of the at least one first weight parameter quantized to the n bit, and a first bit of the don't care parameter quantized to the n bit, and a 2-2 data including a second bit value of the at least one first weight parameter quantized to the n bit, and a second bit of the don't care parameter quantized to the n bit.

BRIEF DESCRIPTION OF THE DRAWINGS

The above and other aspects, and advantages of embodiments of the disclosure will be more apparent from the following description taken in conjunction with the accompanying drawings, in which.

DETAILED DESCRIPTION

Figure 1:
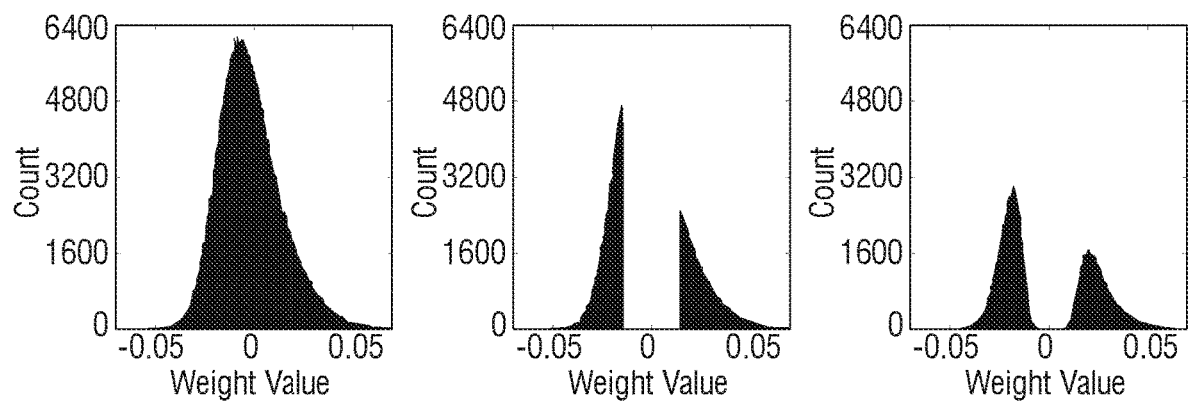
FIG. 1 is a diagram illustrating an example compression method according to the related art.

Embodiments of the disclosure are described in detail with reference to the accompanying drawings. However, it may be understood that the disclosure is not limited to the embodiments described hereinafter, but includes various modifications, equivalents, and/or alternatives of the embodiments of the disclosure. In relation to explanation of the drawings, similar drawing reference numerals may be used for similar constituent elements.

Hereinafter, the terms used in embodiments will be briefly explained, and embodiments will be described in greater detail with reference to the accompanying drawings.

The terms used in the embodiments of the disclosure are general terms that are widely used now and selected considering the functions of the disclosure. However, the terms may vary depending on the intention of a person skilled in the art, a precedent, or the advent of new technology. In addition, in a specified case, the term may be arbitrarily selected. In this case, the meaning of the term will be explained in the corresponding description. Accordingly, the terms used in the description may not necessarily be construed as simple names of the terms, but be defined based on meanings of the terms and overall contents of the disclosure.

The embodiments may vary, and may be provided in different embodiments. Embodiments will be described with reference to accompanying drawings. However, this does not necessarily limit the scope of the embodiments to an embodiment form. Instead, modifications, equivalents and replacements included in the disclosed concept and technical scope of this specification may be employed. While describing embodiments, if it is determined that the description regarding a known technology obscures the gist of the disclosure, the description is omitted.

In the disclosure, relational terms such as first and second, and the like, may be used to distinguish one entity from another entity, without necessarily implying any actual relationship or order between such entities. In embodiments of the disclosure, relational terms such as first and second, and the like, may be used to distinguish one entity from another entity, without necessarily implying any actual relationship or order between such entities.

It is to be understood that the singular forms "a," "an," and "the" include plural referents unless the context clearly dictates otherwise. The terms "include," "comprise," "is configured to," etc., of the description are used to indicate that there are features, numbers, steps, operations, elements, parts or combination thereof, and they may not exclude the possibilities of combination or addition of one or more features, numbers, steps, operations, elements, parts or a combination thereof.

In the disclosure, a 'module' or a 'unit' performs at least one function or operation and may be implemented by hardware or software or a combination of the hardware and the software. In addition, a plurality of 'modules' or a plurality of 'units' may be integrated into at least one module and may be realized as at least one processor except for 'modules' or 'units' that may be realized in a specific hardware.

The above and other aspects of the disclosure will become more apparent by describing in detail embodiments thereof with reference to the accompanying drawings. However, embodiments may be realized in a variety of different configurations, and not limited to descriptions provided herein. Further, those that are irrelevant with the description are omitted to describe embodiments more clearly, and similar drawing reference numerals are used for the similar elements throughout the description.

FIG. 1 is a diagram illustrating an example compression method according to the related art.

As illustrated in FIG. 1, an electronic apparatus 100 may reduce a size of original data by pruning the original data. The data to be compressed may be data associated with an intensity of connection between neurons of a learned neural network. For example, the data may be an intensity of connection between neurons included in a data recognition model, such as a deep neural network (DNN), a recurrent neural network (RNN), and a bidirectional recurrent deep neural network (BRDNN). Hereinafter, a data to be compressed by the electronic apparatus 100 is referred to as a weight parameter. The original data may include a plurality of weight parameters.

The pruning is one of compression methods to delete insignificant weight parameters or weight parameters that do not affect an output value significantly from among weight parameters of an artificial intelligence model. For example, in a case in which a learned connection intensity between neurons is weak or it does not affect an output value significantly, the electronic apparatus 100 may delete the learned connection intensity between the neurons through pruning.

The electronic apparatus 100 may prune data of which a size is less than or equal to a size and retrain a deep learning model by using the remaining data based on a size value of each of the weight parameters, and restore an accuracy of the deep learning model.

For example, it may be assumed that the pruned original data is displayed in a form of a matrix as shown below. The original data that has gone through pruning and retraining has a number of zero values.

$$\begin{pmatrix} 0 & 0 & 0 & 0 \\ 5 & 8 & 0 & 0 \\ 0 & 0 & 3 & 0 \\ 0 & 6 & 0 & 0 \end{pmatrix}$$

That is, the electronic apparatus 100 may go through a pruning process and obtain a number of zero values and some non-zero values. The electronic apparatus 100 may reduce a size of a matrix by eliminating the number of zero values, according to a compressed sparse row (CSR) format. For example, the electronic apparatus may reduce a size of a matrix by transforming the matrix shown above to three matrices as shown below.

$A=[5\ 8\ 3\ 6]$ $IA=[0\ 0\ 2\ 3\ 4]$ $JA=[0\ 1\ 2\ 1]$

The matrix A may be a matrix corresponding to a non-zero value from among the matrices corresponding to the pruned original data. The matrix IA may be a matrix in which the number of non-zero data corresponding to rows from among the matrices corresponding to the pruned original data are cumulated. The matrix JA may be a matrix that is capable of storing a value of a column index corresponding to each of the non-zero values. The electronic apparatus 100 may obtain a matrix corresponding to the pruned original data by using the matrices A, IA and JA.

However, in a case of a compression method by a CSR format, a size of indices is always larger than a size of non-zero data corresponding to the matrix A. Accordingly, there is a problem that it may be necessary to increase a compression rate of index to increase the overall compression rate. In addition, in a case of a compression method by the CSR format, there is a problem that it is not appropriate for a parallel operation. Accordingly, in a case of compressing a deep learning model using a parallel operation processing, there is a drawback that a usage of a memory bandwidth decreases, and a power consumption is large. Accordingly, a compression method capable of performing compression in parallel while maintaining the previous pruning rate is demanded.

Figure 2:
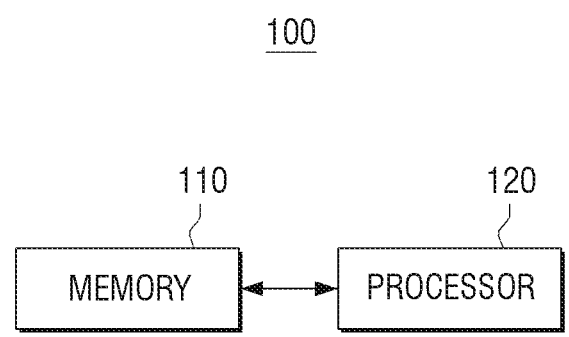
FIG. 2 is a block diagram of a configuration of an electronic apparatus, according to an embodiment.

FIG. 2 is a block diagram of a brief configuration of an electronic apparatus, according to an embodiment.

In this case, the electronic apparatus 100 may be a variety of apparatuses. The electronic apparatus 100 may be implemented as a smartphone, but is not limited thereto. The electronic apparatus 100 may include any one or any combination of a smartphone, a tablet personal computer (PC), a mobile phone, a video phone, an e-book reader, a desktop personal computer (PC), a laptop personal computer (PC), a netbook computer, a workstation, a server, a personal digital assistant (PDA), a portable multimedia player (PMP), and an MP3 player.

In another embodiment, the electronic apparatus 100 may be home appliance. The home appliance may, for example, include any one or any combination of a television, a digital video disk (DVD) player, a stereo, a refrigerator, an air conditioner, a cleaner, an oven, a microwave, a washing machine, an air purifier, a set-top box, a home automation control panel, a security control panel, a TV box (e.g., Samsung HomeSync™, an Apple TV™, or a Google TV™), a game console (e.g., Xbox™ and PlayStation™), an electronic dictionary, an electronic key, a camcorder, and an electronic frame. Alternatively, the electronic apparatus 100 may be a system itself, in which a clouding computing environment is constructed.

The electronic apparatus 100 according to an embodiment may include a memory 110 and a processor 120. However, according to needs of the various electronic apparatuses described above, various elements, such as a display, a communication interface, an input interface, an output interface, a sensor, etc. may be added or omitted.

The memory 110 may store various software and/or programs. The program may include, for example, a kernel, a middleware, an application programming interface (API) and/or an application program (or "application"). At least a portion of the kernel, middleware or API may be referred to as an operating system. The kernel may, for example, control or manage system resources used to execute operations or functions implemented in other programs. In addition, the kernel may provide an interface to control or manage the system resources by accessing individual elements of the electronic apparatus 100 in the middleware, the API or the application program.

The middleware, for example, can act as an intermediary for an API or an application program to communicate with the kernel and exchange data. In addition, the middleware may process one or more job requests received from the application program based on priorities. For example, the middleware may prioritize any one or any combination of the application programs to use the system resources of the electronic apparatus 100, and may process the one or more job requests. An API is an interface for an application to control the functions provided in the kernel or middleware and may include, for example, at least one interface or function (e.g., instruction) for file control, window control, image processing, or character control.

Further, the memory 130 may include either one or both of a built-in memory and an external memory. The built-in memory, for example, may include any one or any combination of a volatile memory (e.g., DRAM, SRAM, or SDRAM, etc.) and a nonvolatile memory (e.g., one time programmable ROM (OTPROM), PROM, EPROM, EEPROM, mask ROM, flash ROM, flash memory, hard drive, or solid state drive (SSD)), such as a non-transitory computer readable storage. The external memory may include a flash drive, for example, a compact flash (CF), a secure digital (SD), a micro-SD, a mini-SD, an extreme digital (xD), a multi-media card (MMC), a memory stick, or the like. The external memory may be functionally or physically connected to the electronic apparatus 100 via various interfaces.

In an embodiment, the memory 110 may store a variety of artificial intelligence models. In addition, the memory 110 may store original data and compressed data. In addition, the memory 110 may store error data that is generated in a process of compressing and decompressing the original data.

In addition, the memory 110 may further store compressed intermediate data, compressed index data and table data used for quantization that are used to compress original data.

The processor 120 is a configuration for controlling the electronic apparatus 100. In detail, the processor 120 may prune original data including a plurality of weight parameters, determine a weight parameter of which a vale has not been changed according to pruning from among weight parameters included in the pruned original data, and obtain index data including location information of a weight value of which a value has not been changed according to pruning. The processor 120 may determine a weight parameter of which a value is changed according to pruning from among the weight parameters included in the pruned original data, and substitute the weight parameter of which the value has been changed according to pruning with a don't care parameter.

The quantization is one of compression methods to lighten a size of a weight parameter. That is, the electronic apparatus 100 may change a size of a weight parameter to a size of a predetermined number of bits to lighten the size of the weight parameter. For example, in a case in which the respective weight parameters has a size of 32 bits, the electronic apparatus 100 may quantize a weight parameter to a predetermined size of 3 bits to lighten the size of the weight parameter. According to an embodiment, a variety of quantization methods may be applied, but the technical idea of the disclosure is not limited to the quantization methods described in the disclosure.

The don't care value refers to a value that is not defined by a value. For example, in a case in which a true/false determination is made by comparing a value (0 or 1) and a don't care value, the don't care value has a true value for any of 0 and 1. By substituting a weight parameter that has been changed to a value of 0 by pruning, as will be described later, when comparing data output by inputting compression candidate data to a Viterbi-decompressor as an input value with the obtained n number of second data, it is possible to compare only a value of a weight parameter of which a value has not been changed with a parameter value of output data regardless of a parameter value of the output data corresponding to the don't care value included in the obtained n number of second data.

The processor 120 may obtain the n number of second data based on the quantized data. The processor 120 may obtain the n number of compressed data by applying the respective obtained n number of second data to a Viterbi algorithm.

In detail, the processor 120 may compress the respective obtained n number of second data by using the existing test data compression method.

Original data including a weight parameter may be represented in a matrix form. For example, the original data may be in the matrix form as shown below.

$$\begin{pmatrix} a & b & c & d \\ e & f & g & h \\ i & j & k & l \\ m & n & o & p \end{pmatrix}$$

However, the matrix representation of the original data may be represented as a variety of m*m matrices in addition to the 4*4 form shown above. However, hereinafter, it will be described that the original data is a matrix form having a size of 4*4 for the convenience of explanation.

In a case in which pruning is performed for the original data, the pruned original data may be represented as shown below.

$$\begin{pmatrix} 0 & 0 & 0 & 0 \\ 5 & 8 & 0 & 0 \\ 0 & 0 & 3 & 0 \\ 0 & 6 & 0 & 0 \end{pmatrix}$$

The processor 120 may determine a weight parameter of which a value has been changed according to pruning from among weight parameters included in the pruned original data, and substitute the weight parameter of which the value has been changed according to pruning with a don't care parameter. The substitution with a don't care value implies that the corresponding value may be any value from among 0 and 1. For convenience of explanation, data that is processed to a don't care parameter will be represented as x. A matrix processed to a don't care parameter may be as shown below.

$$\begin{pmatrix} x & x & x & x \\ 5 & 8 & x & x \\ x & x & 3 & x \\ x & 6 & x & x \end{pmatrix}$$

The processor 120 may quantize a first data including a weight parameter of which a value has not been changed according to pruning and a don't care parameter to a n number of bits. For example, a result of quantizing a first data to 3 bits may be as shown below.

$$\begin{pmatrix} xxx & xxx & xxx & xxx \\ 011 & 111 & xxx & xxx \\ xxx & xxx & 010 & xxx \\ xxx & 100 & xxx & xxx \end{pmatrix}$$

The processor 120 may obtain a n number of second data based on the data that is quantized to n bits. The n number of second data may include a 2-1 data including a first bit value of a weight parameter of which a value has not been changed according to pruning quantized to n bits and a first bit value of a don't care parameter quantized to n bits, and a 2-2 data including a second bit value of a weight parameter of which a value has not been changed according to pruning quantized to n bits and a second bit value of the don't care parameter quantized to n bits. In the same manner, the processor 120 may obtain a 2-3 data to a 2-n data.

For example, in a case in which quantization to 3 bits is performed as described above, the processor 120 may obtain the first to third data as shown below.

$$\begin{pmatrix} x & x & x & x \\ 0 & 1 & x & x \\ x & x & 0 & x \\ x & x & 1 & x \end{pmatrix} \begin{pmatrix} x & x & x & x \\ 1 & 1 & x & x \\ x & x & 1 & x \\ x & x & 0 & x \end{pmatrix} \begin{pmatrix} x & x & x & x \\ 1 & 1 & x & x \\ x & x & 0 & x \\ x & x & 0 & x \end{pmatrix}$$

By obtaining data for each corresponding bit, the processor 120 may obtain a matrix for an independent data.

Because each of parameters included in the data is independent of each other (one parameter does not affect determination of a value of another parameter), as will be described later, it is possible to compress the data by using a test data compression method.

The processor 120 may compare data output by inputting at least one compression candidate data to a Viterbi-decompressor as an input value with the obtained n number of second data, and if the obtained n number of second data and the output data are matched at a predetermined ratio or more, obtain an input value for the output data as compressed data. In this regard, a n number of compressed data may be generated.

The processor 120 may compare only data corresponding to a weight parameter of which a value has not been changed according to pruning from among data included in the respective n number of second data, with the output data. That is, in a case in which comparison is made between a value output by inputting compression candidate data to a Viterbi-decompressor with a first data from among the n number of second data, the processor 120 may not compare data that corresponds to a don't care parameter.

For example, if a value output by inputting the compression candidate data to the Viterbi-decompressor is as shown in the left matrix below and the first data is as shown in the right matrix below, the processor 120 may obtain a compression candidate data input to a Viterbi-decompressor as a first compressed data because values of the remaining parameters excluding a don't care parameter of the first data are identical to values output by inputting a compression candidate data to the Viterbi-decompressor.

$$\begin{pmatrix} 1 & 1 & 1 & 1 \\ 0 & 1 & 0 & 0 \\ 1 & 0 & 0 & 1 \\ 0 & 1 & 1 & 1 \end{pmatrix} \begin{pmatrix} x & x & x & x \\ 0 & 1 & x & x \\ x & x & 0 & x \\ x & x & 1 & x \end{pmatrix}$$

The processor 120 may obtain index data from the pruned original data. The index data may be data for searching for a location of a weight parameter of which a value has not been changed according to pruning.

For example, it may be assumed that the index data is as shown below.

$$\begin{pmatrix} 0 & 0 & 0 & 0 \\ 1 & 1 & 0 & 0 \\ 0 & 0 & 1 & 0 \\ 0 & 1 & 0 & 0 \end{pmatrix}$$

The processor 120 may compress index data by using the Viterbi algorithm. The compressed index data may be, for example, [0 1 1 0].

In detail, the compressed index data may be obtained through the method for obtaining the n number of compressed data as described above. For example, the processor 120 may compare data output by inputting at least one compression candidate data to the Viterbi-decompressor as an input value with the index data, and if the index data and the output data are matched at over a predetermined ratio, obtain the input value for the output data as compressed index data.

Through the method described above, the processor 120 may compress original data and obtain a n number of compressed data and compressed index data. The processor 120 may decompress compressed data. In detail, the processor 120 may decompress the n number of compressed data and the compressed index data and restore original data. The processor 120 may substitute a don't care parameter with a preset value (e.g., 0). That is, the processor 120 may substitute a weight value of which a value has been changed according to pruning with a preset value.

When an error is present between the decompressed original data and the original data before decompression, the processor 120 may apply the n number of second data obtained based on the data quantized to n bits to an artificial intelligence model as an input value, and retrain the error.

In the embodiment described above, it is described that the n number of data and the index data are compressed using the Viterbi decompressor, but the example is not limited thereto. That is, the processor 120 may compress the original data by using various decoders that are capable of performing parallel operation other than the Viterbi decompressor.

The processor 120 may also be implemented as any one or any combination of an application specific integrated circuit (ASIC), an embedded processor, a microprocessor, hardware control logic, a hardware finite state machine (FSM), a digital signal processor A DSP, and the like. The processor 120 may further include an interface, such as a bus, for communicating with each of the configurations.

The processor 120 may, for example, control a number of hardware or software elements connected to the processor 120 by driving an operating system or application program, and perform various data processing and calculations. The processor 120, for example, may be realized as a system on chip (SoC). According to an embodiment, the processor 120 may further include a graphic processing unit (GPU) and/or an image signal processor. The processor 120 may load and process an instruction or data received from any one or any combination of other elements (e.g., nonvolatile memory, such as a non-transitory computer readable storage) to a volatile memory, and store result data in the nonvolatile memory.

In the embodiment described above, a process of compressing original data and a process of decompressing the compressed data are performed in one electronic apparatus 100, but the example is not limited thereto. That is, an electronic apparatus compressing original data and an electronic apparatus decompressing the compressed data may be different from each other. For example, the data compression may be performed in a server, and the data decompression may be performed in a user terminal.

Figure 3:
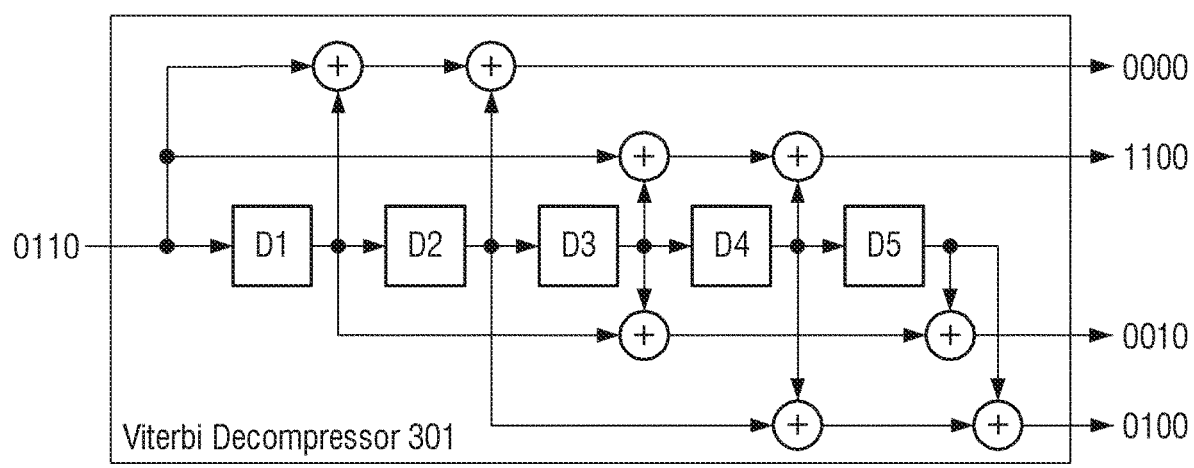
FIG. 3 is a diagram illustrating an example method for compressing index data, according to an embodiment.

FIG. 3 is a diagram illustrating an example method for compressing index data, according to an embodiment.

As illustrated in FIG. 3, the compression of index data may be performed using a Viterbi decompressor 301. As described above, in a case in which the pruned original data is in a form of a matrix as shown on the left below, index data for decompressing non-zero data to the pruned original data may be in a form of a matrix on the right below.

$$\begin{pmatrix} 0 & 0 & 0 & 0 \\ 5 & 8 & 0 & 0 \\ 0 & 0 & 3 & 0 \\ 0 & 6 & 0 & 0 \end{pmatrix} \begin{pmatrix} 0 & 0 & 0 & 0 \\ 1 & 1 & 0 & 0 \\ 0 & 0 & 1 & 0 \\ 0 & 1 & 0 & 0 \end{pmatrix}$$

The processor 120 may obtain an input value of the Viterbi decompressor 301 in which output values of the Viterbi decompressor 301 illustrated in FIG. 3 become (0 0 0 0), (1 1 0 0), (0 0 1 0), and (0 1 0 0) from the top. For example, output values when (0 1 1 0) is input to the Viterbi decompressor 301 may be (0 0 0 0), (1 1 0 0), (0 0 1 0), and (0 1 0 0) from the top. The processor 120 may identify an input value (0 1 1 0) as compressed index data.

That is, the processor 120 may obtain original index data by using (0 1 1 0) and the Viterbi decompressor 301. Thus, the processor 120 may identify (0 1 0 0) as compressed index data. Further, in a case in which the Viterbi decompressor 301 is used, the processor 120 may compress the index data in parallel.

Figure 4:
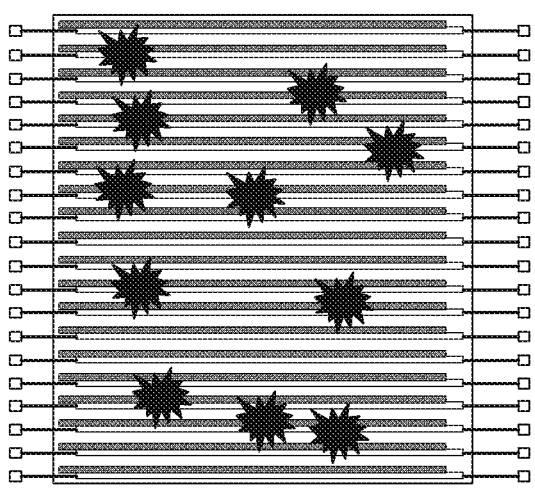
FIG. 4 is a diagram illustrating an example method for compressing non-zero data, according to an embodiment.

FIG. 4 is a diagram illustrating an example method for compressing non-zero data, according to an embodiment.

For efficient compression, the processor 120 may quantize pruned original data and reduce a size of data. Various quantization techniques may be applied to a method for quantizing pruned data. In an embodiment, the processor 120 may quantize original data by the preset bit.

For convenience of explanation, it is assumed that the pruned original data is quantized to 3 bits. In this regard, the data quantized to 3 bits may be as shown below.

$$\begin{pmatrix} xxx & xxx & xxx & xxx \\ 011 & 111 & xxx & xxx \\ xxx & xxx & 010 & xxx \\ xxx & 100 & xxx & xxx \end{pmatrix}$$

As described above, the processor 120 may obtain three data based on data that is quantized to 3 bits. In a case in which quantization to n bits is performed, it is possible to obtain a n number of second data.

$$\begin{pmatrix} x & x & x & x \\ 0 & 1 & x & x \\ x & x & 0 & x \\ x & x & 1 & x \end{pmatrix} \begin{pmatrix} x & x & x & x \\ 1 & 1 & x & x \\ x & x & 1 & x \\ x & x & 0 & x \end{pmatrix} \begin{pmatrix} x & x & x & x \\ 1 & 1 & x & x \\ x & x & 0 & x \\ x & x & 0 & x \end{pmatrix}$$

The processor 120 may compress the obtained n number of second data. In detail, the processor 120 may compress the n number of data by using the existing test data compression method.

In detail, in the existing test data compression method, in a case in which a target data (or target faults) to be identified is present, the test data (or test cubes) including the target data and a don't care parameter other than the target data may be generated. The test equipment may decompress the target data by inputting a ratio corresponding to the target data for each clock cycle.

That is, test data in the test data compression method may have a data structure mostly of don't care parameters and the test equipment periodically inputs data as much as a given ratio for each clock cycle. Thus, it is advantageous that a parallel decoding method is used.

In detail, as illustrated in FIG. 4, the generated test data obtained from random fill may, for example, include don't care parameters of 95-99% and the remaining data that are not don't care parameters. The test data may be compressed using a decoder that is a capable of receiving data of a size of data that is not a don't care parameter from among the test data. For example, in a case in which a size of test data is 1000 bits and a don't care parameter is 900 bits, the test apparatus may apply a predetermined ratio of bits with respect to 100 bits that are not don't care parameters, as an input value (for example, either input 10 bits ten times per clock as an input value or input 1 bit 100 times per clock) and accurately fill data that are not don't care parameters. That is, the test apparatus may fill don't care parameters from among the test data with an arbitrary value, but may accurately fill values that are not don't care parameters. In an embodiment, it is possible to compress a n number of data by using a test apparatus satisfying the feature described above.

In conclusion, the processor 120 may change a weight parameter of which a value has been changed according to pruning to a don't care a non-zero parameter and perform compression using the test data compression method, thereby improving the compression efficiency.

In an embodiment, in a case in which a decoder that is used in the test apparatus is the Viterbi decompressor 301 as illustrated in FIG. 3, a data compression apparatus having a compression efficiency of four times can be realized.

The electronic apparatus 100 may compress intermediate data by using the test data compression method described above. For example, in a case in which the electronic apparatus 100 obtains 3 data as described above, the 3 obtained data may include 36 don't care parameters and 12 parameters that are not don't care parameters. According to the method described above, the electronic apparatus 100 may a predetermined ratio of bits to 12 bits as an input value. For example, the electronic apparatus 100 may input an input value of 1 bit 12 times, input an input value of 2 bits 6 times, or input an input value of 3 bits 4 times.

In conclusion, when any one from among the n number of second data is output for an input value applied for each clock, the electronic apparatus 100 may obtain the applied input value as any one from among the n number of compressed second data.

In conclusion, the processor 120 may identify a location of pruned original data through an index data (or compressed index data or masking bit data) and thus, it is not necessary to compress the n number of second data so that a value of the pruned original data satisfies zero (i.e., a don't care parameter). Accordingly, it does not matter which of 0 or 1 is input to a location of the pruned original data (that is, by substituting a weight parameter of which a value has been changed according to pruning with a don't care parameter), and thereby the compression efficiency can be increased.

As described above, a Viterbi decompressor may be used to compress original data so that compression data having a fixed compression ratio in all cycles may be generated. Accordingly, there is an advantage that the usage of a memory bandwidth may be enhanced and that it is possible to perform a parallel operation in a compression process. Furthermore, the Viterbi decompressor may be implemented with only a flip/flop and an XOR gate, so that hardware of the electronic apparatus 100 can have a simple configuration.

An error may occur even in a case in which original data is compressed using the method described above. In detail, the compression by the test data compression method described above may have an accuracy of approximately 96 to 98%. This probability may be called an encoding efficiency, and the compression rate in this case may correspond to 1/(1-pruning rate). The electronic apparatus 100 may improve an accuracy of an occurred error through a retraining process of deep learning, or may store data in which an error has occurred in the memory 110 and use the stored data to decompress original data.

Figure 5:
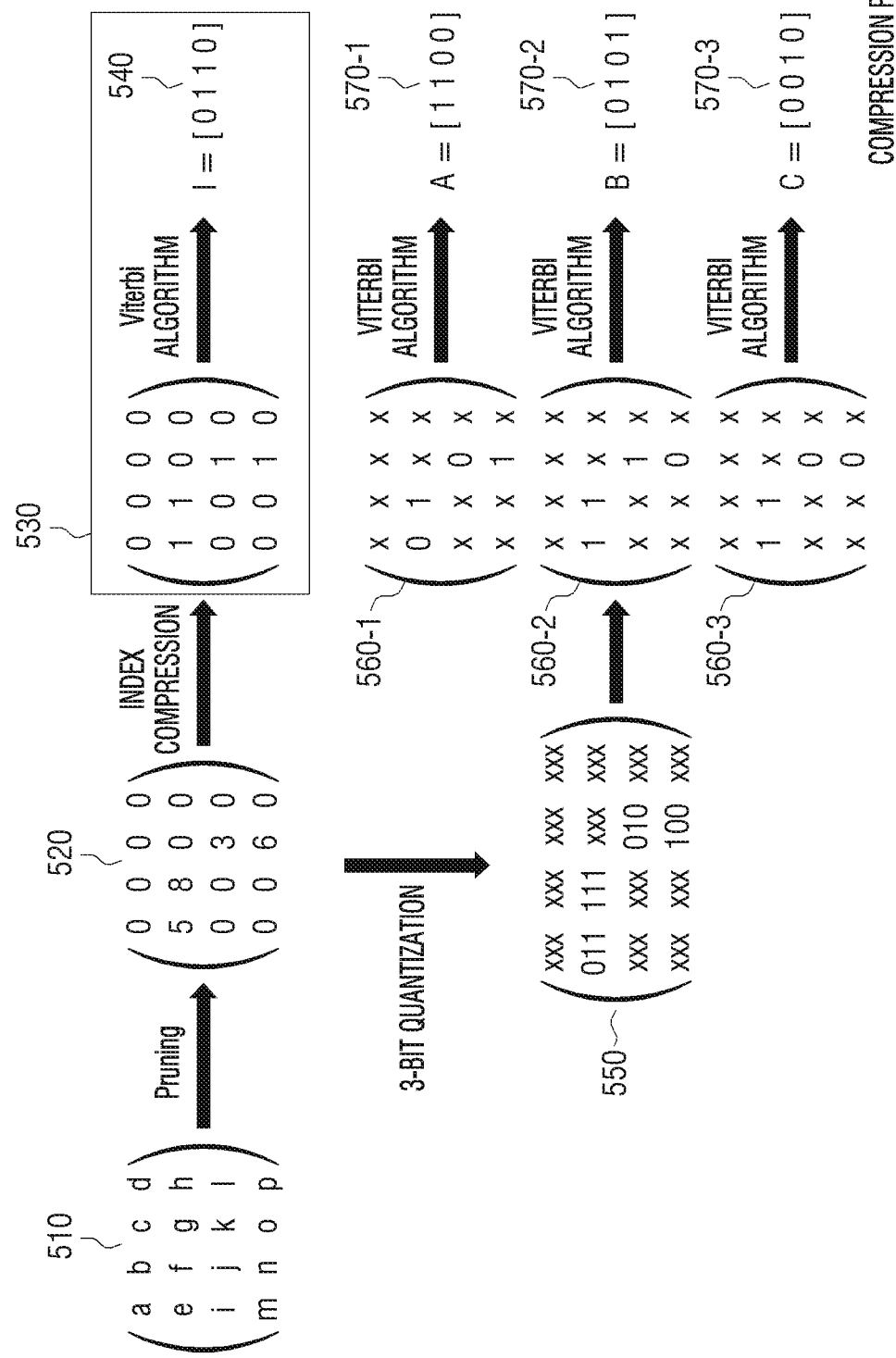
FIG. 5 is a diagram for explaining a data compression method, according to an embodiment.

FIG. 5 is a diagram for explaining an example data compression method, according to an embodiment.

As illustrated in FIG. 5, the electronic apparatus 100 may prune original data 510. The electronic apparatus 100 may obtain index data 530 based on the pruned original data. In detail, the electronic apparatus 100 may index data 53 for finding a location of a weight parameter of which a value has not been changed according to pruning from among pruned original data 520. The electronic apparatus 100 may compress the index data 530 by using a Viterbi-decompressor.

The electronic apparatus 100 may quantize the pruned original data 520 to 3 bits. The electronic apparatus 100 may also quantize the pruned original data 520 by n bits. A weight parameter of which a value has been changed according to pruning may be substituted with a don't care parameter. In detail, the weight parameter of which the value has been changed according to pruning may be substituted before quantization to 3 bits is performed. However, the example is not limited thereto, and the weight parameter of which the value has been changed according to pruning may be substituted after being quantized to 3 bits.

The electronic apparatus 100 may obtain 3 data based on data 550 that is quantized to 3 bits. In detail, the electronic apparatus 100 may obtain a first data 560-1 including first bits from among the respective parameters including 3 bits included in the data 550 quantized to 3 bits, a second data 560-2 including second bits from among the respective parameters including 3 bits included in the data 550 quantized to 3 bits, and a third data 560-3 including third bits from among the respective parameters including 3 bits included in the data 550 quantized to 3 bits.

The electronic apparatus 100 may compress each of the obtained first to third data 560-1 to 560-3 by using a Viterbi-decompressor.

In conclusion, the electronic apparatus 100 may obtain a compressed index data 540, a compressed first data 570-1, a compressed second data 570-2 and a compressed third data 570-3 through the compression method described above.

Figure 6:
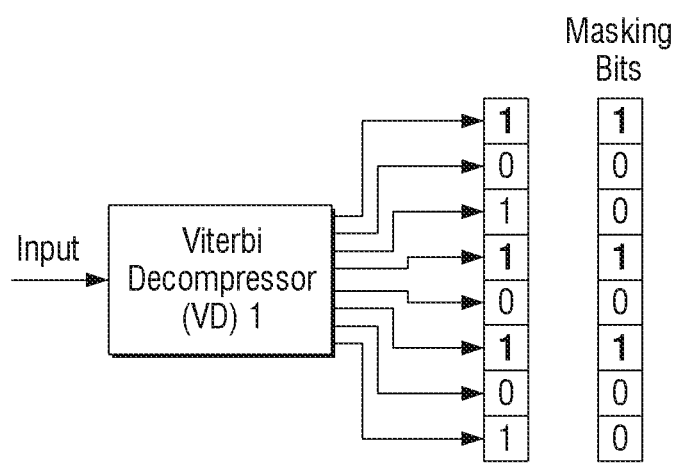
FIGS. 6 and 7 are diagrams for explaining a method for decompressing original data, according to embodiments.
Figure 7:
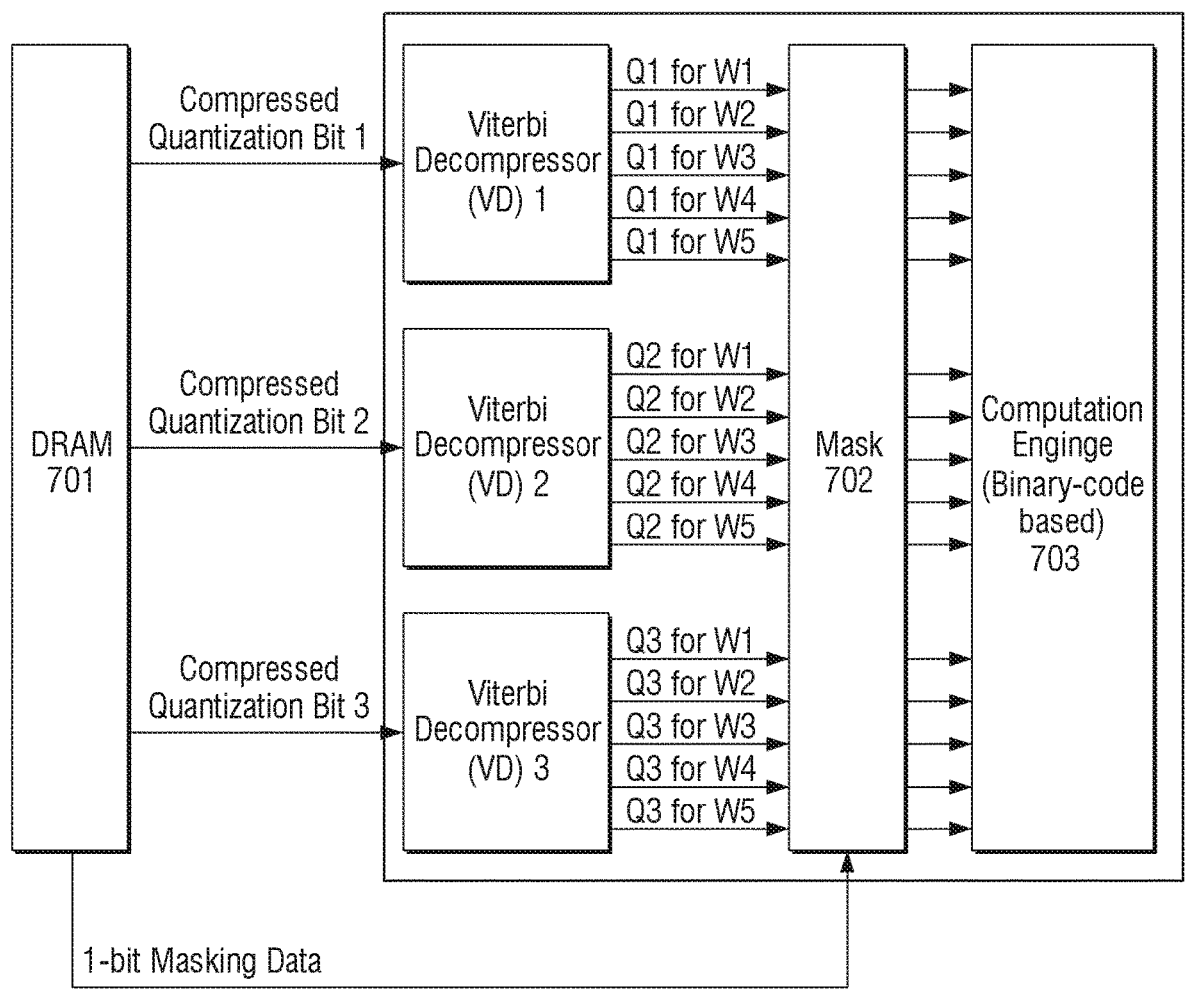

FIGS. 6 and 7 are diagrams for explaining a method for decompressing original data, according to embodiments.

In detail, the processor 120 may obtain a n number of compressed data from the memory 100 (e.g., a DRAM 701), and input the compressed n number of compressed second data (e.g., compressed quantization bits 1, 2 and 3 in FIG. 7) in a Viterbi decompressor (VD) (e.g., VD 1, 2 or 3 in FIG. 7). The processor 120 may decompress original data by using data and index data (e.g., Q1 for W1-W5, Q2 for W1-W5 and Q3 for W1-W5 in FIG. 7) (or masking bit data) output through the Viterbi decompressor. The index data (or the masking bit data) may be data that is generated through the compressed index data. For example, the index data may be a result that is output by inputting the compressed index data to the Viterbi decompressor. The index data may be data for distinguishing a weight parameter of which a value has been changed according to pruning from a weight parameter of which a value has not been changed according to pruning. That is, the electronic apparatus 100 (e.g., via a mask 702 and a binary-code based computation engine 703 of FIG. 7) may substitute a value of the weight parameter of which the value has been changed according to pruning with zero by using the index data. In detail, the electronic apparatus 100 may operate an output value and an index data and decompress the data.

In conclusion, the compressed data may be primarily decompressed through the Viterbi decompressor, and the weight parameter of which the value has been changed according to pruning from among the data decompressed through the Viterbi decompressor may be substituted with a value of 0 by using the masking bit and the same data as the original data may be decompressed.

The circuit structure illustrated in FIG. 6 is a diagram illustrating an example method for decompressing compressed data in a case in which quantization to 1 bit is performed in the compression process. That is, a circuit structure to decompress original data may differ depending on the number of bits to which quantization is performed in the compression process. For example, in a case in which original data is quantized to 3 bits, the processor 120 for decompressing original data may be implemented as in FIG. 7.

In the embodiment described above, the compression and decompression of data are performed by one electronic apparatus, but is not limited thereto. That is, the electronic apparatus 100 may be any one of an electronic apparatus for compressing original data and an electronic apparatus for decompressing compressed data.

Figure 8:
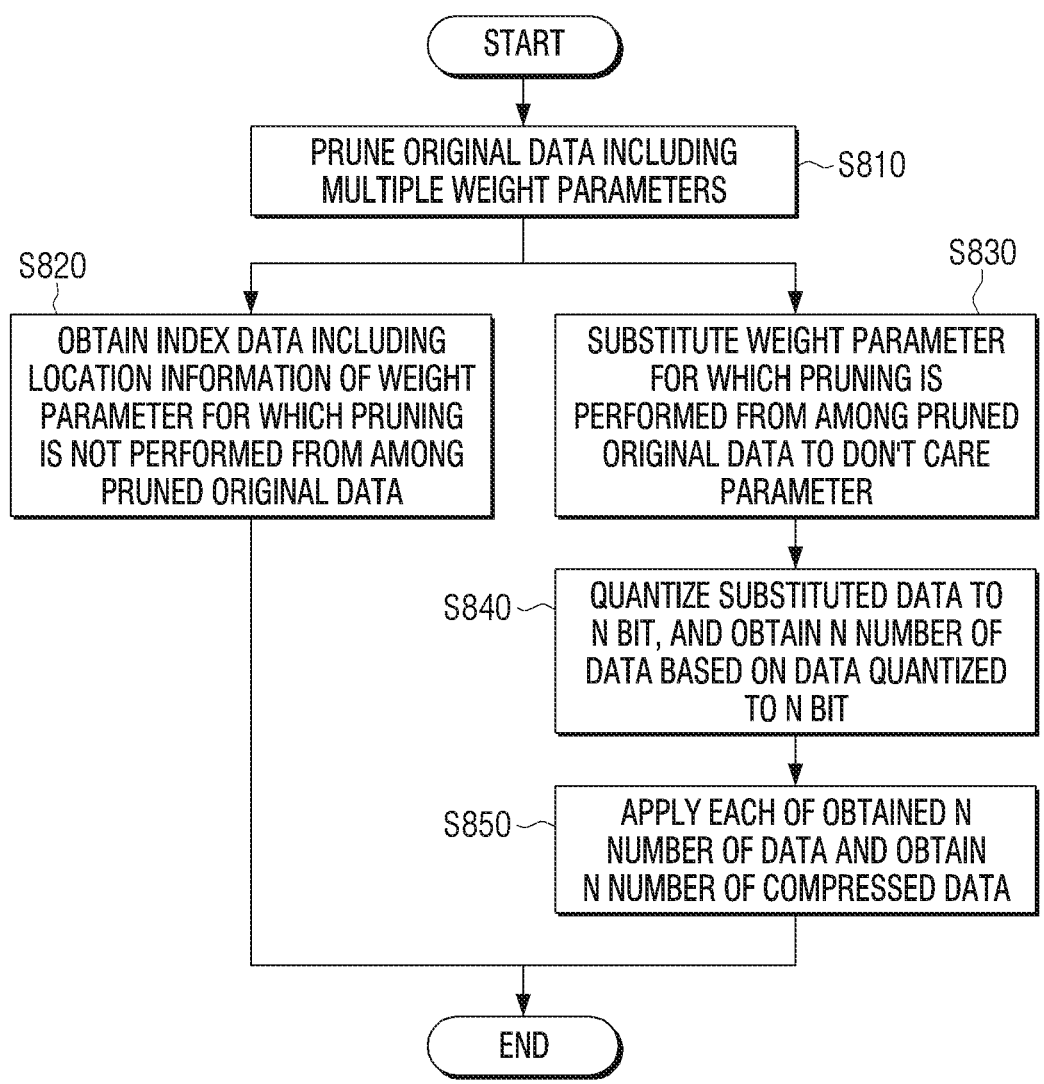
FIG. 8 is a flowchart for a method for compressing data, according to an embodiment.

FIG. 8 is a flowchart for a method for compressing data, according to an embodiment.

First, the electronic apparatus 100 may prune original data including a plurality of weight parameters, at operation S810. The original data may be data including a weight parameter used for deep learning. In detail, the original data may be data for a size value for the weight parameter.

The electronic apparatus 100 may obtain index data including location information of a weight parameter of which a value is not changed according to pruning from among the pruned original data, at operation S820. The electronic apparatus 100 may compress the obtained index data by using the Viterbi algorithm.

The electronic apparatus 100 may substitute a weight parameter of which a value has been changed according to pruning from among the pruned original data with a don't care parameter, at operation S830.

The electronic apparatus 100 may quantize the substituted data to n bits, and obtain a n number of second data based on the data quantized to n bits, at operation S840.

The electronic apparatus 100 may apply each of the obtained n number of second data to a Viterbi algorithm and obtain a n number of compressed data, at operation S850. In detail, the electronic apparatus 100 may identify an input value which is capable of decompressing a weight parameter of which a value has not been changed according to pruning as compressed data by using the test data compression method.

The electronic apparatus 100 may input the compressed data to the Viterbi decompressor and decompress original data. In a case in which an error between the decompressed data and the original data is present, the error may be corrected through a deep learning-based re-learning. The electronic apparatus 100 may re-quantize the relearned data and perform the compression process described above.

Figure 9:
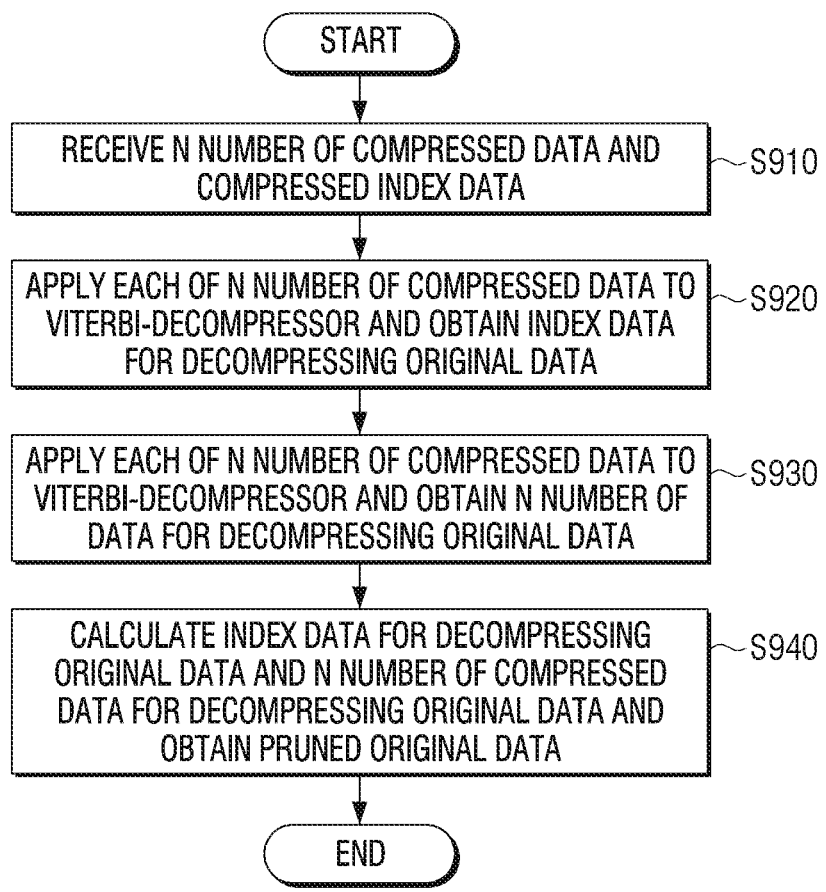
FIG. 9 is a flowchart for explaining a data decompression method, according to an embodiment.

FIG. 9 is a flowchart for explaining a method for decompressing data, according to an embodiment.

The electronic apparatus 100 may receive a n number of second data compressed according to the embodiment described with reference to FIG. 8 and the compressed index data, at operation S910.

The electronic apparatus 100 may apply each of the n number of compressed second data to a Viterbi-decompressor and obtain index data for decompressing original data, at operation S920.

The electronic apparatus 100 may apply each of the n number of compressed data to the Viterbi-decompressor and obtain a n number of second data for decompressing original data, at operation S930.

The electronic apparatus 100 may calculate index data for decompressing original data and a n number of compressed data for decompressing original data and obtain pruned original data, at operation S940.

The examples of FIGS. 8 and 9 are limited to a case in which an electronic apparatus compressing data and an electronic apparatus decompressing data are independent of each other. In this case, the electronic apparatus for data compression may be a server having a large storage space and computation capacity, and the electronic apparatus for data decompression may be a user terminal having a relatively small storage space and computation capacity as compared with a server. However, the compression and decompression of data may be performed in one electronic apparatus.

The disclosure is not necessarily limited to these embodiments, as all the elements constituting the embodiment of the disclosure are described as being combined or operated in one operation. That is, within the scope of the disclosure, all of the elements may be selectively coupled to one or more of them. In addition, although all of the components may be implemented as one independent hardware, some or all of the components may be selectively combined and implemented as a computer program having a program module to perform a part or all of the functions in one or a plurality of hardware.

At least some of the devices (e.g., modules or functions thereof) or methods (e.g., operations) according to embodiments may be implemented to be a program module format of instructions stored in a transitory or non-transitory computer readable recording medium. When an instruction is executed by a processor (e.g., the processor 120), the processor may perform a function corresponding to the instruction.

Here, the program may be stored in a computer-readable non-transitory recording medium and read and executed by a computer, thereby realizing the embodiments of the disclosure.

Here, the non-transitory readable recording medium refers to a medium that semi-permanently stores data and is capable of being read by a device, and includes a register, a cache, a buffer, and the like, but does not include transmission media such as a signal, a current, etc.

In detail, the programs described above may be stored and provided in the non-transitory computer readable medium such as a CD, a digital versatile disk (DVD), a hard disk, a Blu-ray disk, a USB, an internal memory, a memory card, a ROM, a RAM, or the like.

In addition, the method according to the above-described embodiments may be provided as a computer program product.

The computer program product may include an S/W program, a computer readable storage medium in which the S/W program is stored or a product traded between a seller and a consumer.

For example, the computer program product may include an electronic apparatus or a product (e.g., a downloadable app) in the form of an S/W program electronically distributed by a manufacturer of the electronic apparatus or an electronic market (e.g., Google play store and App store). For electronic distribution, at least some of the S/W program may be stored in the storage medium or may be temporarily generated. In this case, the storage medium may be a server of a manufacturer, a server of an electronic market or a relay server which temporarily stores an S/W program.

While the inventive concept has been shown and described with reference to embodiments thereof, it will be understood by those skilled in the art that various changes in form and details may be made therein without departing from the spirit and scope of the inventive concept as defined by the appended claims.

What is claimed is:

1. A data compression method of compressing a weight parameter of an artificial intelligence model, the data compression method comprising:
   pruning, by a processor, an original data comprising a plurality of weight parameters;
   identifying, by the processor, at least one first weight parameter of which at least one first value is not changed by the pruning, among multiple weight parameters included in the pruned original data;
   obtaining, by the processor, a first index data comprising location information of the at least one first weight parameter of which the at least one first value is not changed;
   identifying, by the processor, at least one second weight parameter of which at least one second value is changed by the pruning, among the multiple weight parameters included in the pruned original data;
   substituting, by the processor, the at least one second weight parameter of which the at least one second value is changed with a don't care parameter,
   quantizing, by the processor, to a n bit, a first data comprising the at least one first weight parameter of which the at least one first value is not changed and the don't care parameter with which the at least one second weight parameter is substituted;
   obtaining, by the processor, a n number of second data, based on the first data quantized to the n bit; and
   obtaining, by the processor, a n number of compressed data by applying, to a Viterbi algorithm, each of the obtained n number of second data.

2. The data compression method as claimed in claim 1, wherein the first data is in a matrix form, and
   wherein the quantizing the first data comprises quantizing each of the at least one first weight parameter of which the at least one first value is not changed and the don't care parameter with which the at least one second weight parameter is substituted, in the matrix form.

3. The data compression method as claimed in claim 2, wherein the n number of second data comprises:
   a 2-1 data comprising a first bit value of the at least one first weight parameter quantized to the n bit, and a first bit of the don't care parameter quantized to the n bit; and
   a 2-2 data comprising a second bit value of the at least one first weight parameter quantized to the n bit, and a second bit of the don't care parameter quantized to the n bit.

4. The data compression method as claimed in claim 1, wherein the obtaining the n number of compressed data comprises:
   comparing an output data that is output by inputting at least one compression candidate data to at least one Viterbi decompressor, with the obtained n number of second data; and
   based on the obtained n number of second data and the output data being matched at over a predetermined ratio, obtaining the at least one compression candidate data, as the n number of compressed data.

5. The data compression method as claimed in claim 4, wherein the comparing comprises comparing only pieces of data corresponding to the at least one first weight parameter of which the at least one first value is not changed, among the n number of second data, with the output data.

6. The data compression method as claimed in claim 1, further comprising obtaining a compressed index data by applying the first index data to the Viterbi algorithm.

7. The data compression method as claimed in claim 6, wherein the obtaining the compressed index data comprises:
comparing an output data that is output by inputting at least one compression candidate data to a Viterbi-decompressor, with the first index data; and
based on the first index data and the output data being matched at over a predetermined ratio, obtaining the at least one compression candidate data, as the compressed index data.

8. The data compression method as claimed in claim 6, further comprising storing the compressed index data, the n number of compressed data, and a table data for the quantizing.

9. An electronic apparatus for compressing a weight parameter of an artificial intelligence model, the apparatus comprising:
a memory storing instructions; and
a processor configured to execute the stored instructions to:
prune an original data comprising a plurality of weight parameters;
identify at least one first parameter of which at least one first value is not changed by the pruning, from among multiple weight parameters included in the pruned original data;
obtain a first index data comprising location information of the at least one first weight parameter of which the at least one first value is not changed;
identify at least one second weight parameter of which at least one second value is changed by the pruning, among the multiple weight parameters included in the pruned original data;
substitute the at least one second weight parameter of which the at least one second value is changed with a don't care parameter;
quantize, to a n bit, a first data comprising the at least one first weight parameter of which the at least one first value is not changed and the don't care parameter with which the at least one second weight parameter is substituted;
obtain a n number of second data, based on the first data quantized to the n bit; and
obtain a n number of compressed data by applying, to a Viterbi algorithm, each of the obtained n number of second data.

10. The electronic apparatus as claimed in claim 9, wherein the first data is in a matrix form, and
wherein the processor is further configured to execute the stored instructions to quantize each of the at least one first weight parameter of which the at least one first value is not changed and the don't care parameter with which the at least one second weight parameter is substituted, in the matrix form.

11. The electronic apparatus as claimed in claim 10, wherein the n number of second data comprises:
a 2-1 data comprising a first bit value of the at least one first weight parameter quantized to the n bit, and a first bit of the don't care parameter quantized to the n bit; and
a 2-2 data comprising a second bit value of the at least one first weight parameter quantized to the n bit, and a second bit of the don't care parameter quantized to the n bit.

12. The electronic apparatus as claimed in claim 9, wherein the processor is further configured to execute the stored instructions to:
compare an output data that is output by inputting at least one compression candidate data to at least one Viterbi decompressor, with the obtained n number of second data; and
based on the obtained n number of second data and the output data being matched at over a predetermined ratio, obtain the at least one compression candidate data, as the n number of compressed data.

13. The electronic apparatus as claimed in claim 12, wherein the processor is further configured to execute the stored instructions to compare only pieces of data corresponding to the at least one first weight parameter of which the at least one first value is not changed, among the n number of second data, with the output data.

14. The electronic apparatus as claimed in claim 9, wherein the processor is further configured to execute the stored instructions to obtain a compressed index data by applying the first index data to the Viterbi algorithm.

15. The electronic apparatus as claimed in claim 14, wherein the processor is further configured to execute the stored instructions to:
compare an output data that is output by inputting at least one compression candidate data to a Viterbi-decompressor, with the first index data; and
based on the first index data and the output data being matched at over a predetermined ratio, obtain the at least one compression candidate data, as the compressed index data.

16. The electronic apparatus as claimed in claim 14, wherein the memory is further configured to store the compressed index data, the n number of compressed data, and a table data for quantization of the first data.

17. A decompression method of decompressing a compressed data, the decompression method comprising:
receiving, by a processor, a compressed index data and a n number of compressed data;
obtaining, by the processor, a first index data by applying the compressed index data to a first Viterbi decompressor;
obtaining, by the processor, a n number of first data by applying the n number of compressed data respectively to a plurality of Viterbi decompressors; and
obtaining, by the processor, a pruned original data, based on the first index data and the n number of first data.

18. The decompression method as claimed in claim 17, further comprising:
inputting the pruned original data to an artificial intelligence model;
retraining the artificial intelligence model to which the pruned original data is input; and
obtaining a plurality of weight parameters applied to the artificial intelligence model, based on a result of the retraining.

19. An electronic apparatus for decompressing a compressed data, the apparatus comprising:
a memory storing instructions; and
a processor configured to execute the stored instructions to:
receive a compressed index data and a n number of compressed data;

obtain a first index data by applying the compressed index data to a first Viterbi decompressor;

obtain a n number of first data by applying the n number of compressed data respectively to a plurality of Viterbi decompressors; and obtain a pruned original data, based on the first index data and the n number of first data.

20. The electronic apparatus as claimed in claim 19, wherein the processor is configured to:

input the pruned original data to an artificial intelligence model;

retrain the artificial intelligence model to which the pruned original data is input; and obtain a plurality of weight parameters applied to the artificial intelligence model, based on a result of retraining the artificial intelligence model.

21. A data compression method comprising:

pruning, by a processor, an original data comprising a plurality of weight parameters of an artificial intelligence model;

obtaining, by the processor, a first index data comprising location information of at least one first weight parameter of which at least one first value is not changed by the pruning, among multiple weight parameters included in the pruned original data;

obtaining, by the processor, a first data by:

substituting, by the processor, with a don't care parameter, at least one second weight parameter of which at least one second value is changed by the pruning, among the multiple weight parameters included in the pruned original data; and quantizing, by the processor, to a n bit, the at least one first weight parameter of which the at least one first value is not changed and the don't care parameter with which the at least one second weight parameter is substituted;

obtaining, by the processor, a second data, based on the first data quantized to the n bit; and obtaining, by the processor, a compressed index data and a compressed data by applying, to a Viterbi algorithm, each of the first index data and the second data.

22. The data compression method of claim 21, wherein the second data comprises:

a 2-1 data comprising a first bit value of the at least one first weight parameter quantized to the n bit, and a first bit of the don't care parameter quantized to the n bit; and a 2-2 data comprising a second bit value of the at least one first weight parameter quantized to the n bit, and a second bit of the don't care parameter quantized to the n bit.

* * * * *